United States Patent
Chen

(10) Patent No.: US 10,665,573 B2
(45) Date of Patent: May 26, 2020

(54) MANUFACTURING METHOD OF MICRO LIGHT-EMITTING DIODE DISPLAY PANEL HAVING ELASTIC CONDUCTIVE LAYER FILLED BETWEEN PIXEL ELECTRODE AND MICRO LIGHT-EMITTING DIODE AND MICRO LIGHT-EMITTING DIODE DISPLAY PANEL MANUFACTURED WITH THE SAME

(71) Applicant: Shenzhen China Star Optoelectronics Technology Co., Ltd., Shenzhen (CN)

(72) Inventor: Lixuan Chen, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 16/096,692

(22) PCT Filed: Sep. 13, 2018

(86) PCT No.: PCT/CN2018/105589
§ 371 (c)(1),
(2) Date: Oct. 25, 2018

(87) PCT Pub. No.: WO2019/205437
PCT Pub. Date: Oct. 31, 2019

(65) Prior Publication Data
US 2019/0333897 A1    Oct. 31, 2019

(30) Foreign Application Priority Data
Apr. 28, 2018    (CN) .......................... 2018 1 0403827

(51) Int. Cl.
*H01L 25/075* (2006.01)
*H01L 33/62* (2010.01)
(Continued)

(52) U.S. Cl.
CPC .......... *H01L 25/0753* (2013.01); *H01L 33/36* (2013.01); *H01L 33/44* (2013.01);
(Continued)

(58) Field of Classification Search
CPC combination set(s) only.
See application file for complete search history.

(56) References Cited

U.S. PATENT DOCUMENTS

2007/0090387 A1*  4/2007  Daniels .................. H01L 24/75
                                                257/99
2015/0221712 A1*  8/2015  Yu ....................... H01L 27/3251
                                                257/40
(Continued)

FOREIGN PATENT DOCUMENTS

CN          101630210 A      1/2010
CN          103907190 A      7/2014
(Continued)

*Primary Examiner* — Nduka E Ojeh
(74) *Attorney, Agent, or Firm* — Leong C. Lei

(57) ABSTRACT

The invention provides a manufacturing method of micro LED display panel and micro LED display panel. In the manufacturing method, an elastic conductive layer is formed on the upper pixel electrode on the package substrate. When the package substrate and the driving substrate are assembled, the upper pixel electrode and the upper electrode of the micro LED are electrically connected through the elastic conductive layer, and the elasticity of the elastic conductive layer is utilized to fill the height difference between the individual micro LEDs, avoid poor connection between the upper pixel electrode and the upper electrode of the micro LED, and improve the assembling effect of the micro LED display panel and the process yield of the micro LED display panel.

6 Claims, 3 Drawing Sheets

(51) Int. Cl.
*H01L 33/36* (2010.01)
*H01L 33/44* (2010.01)

(52) U.S. Cl.
CPC ...... *H01L 33/62* (2013.01); *H01L 2933/0016* (2013.01); *H01L 2933/0033* (2013.01); *H01L 2933/0066* (2013.01)

(56) References Cited

U.S. PATENT DOCUMENTS

| | | | | |
|---|---|---|---|---|
| 2016/0155892 | A1* | 6/2016 | Li | H01L 24/00 257/89 |
| 2018/0053808 | A1* | 2/2018 | Chu | H01L 27/156 |
| 2019/0148409 | A1* | 5/2019 | Bang | H01L 27/124 345/173 |

FOREIGN PATENT DOCUMENTS

| | | |
|---|---|---|
| CN | 104115266 A | 10/2014 |
| CN | 107068707 A | 8/2017 |
| CN | 108493154 A | 9/2018 |

* cited by examiner

MANUFACTURING METHOD OF MICRO LIGHT-EMITTING DIODE DISPLAY PANEL HAVING ELASTIC CONDUCTIVE LAYER FILLED BETWEEN PIXEL ELECTRODE AND MICRO LIGHT-EMITTING DIODE AND MICRO LIGHT-EMITTING DIODE DISPLAY PANEL MANUFACTURED WITH THE SAME

BACKGROUND OF THE INVENTION

1. Field of the Invention

The present invention relates to the field of display, and in particular to a manufacturing method of micro light-emitting diode (micro LED) display panel and micro LED display panel.

2. The Related Arts

With the rapid development of wearable display devices, micro-LED (uLED) technology has emerged. The micro LED technology, i.e., the LED micro-reduction and matrixing technology, refers to a high-density, micro-sized LED array that is integrated on a single chip. The power consumption of the micro LED is much lower than that of a liquid crystal display (LCD), is self-luminous like an organic light-emitting diode (OLED), and can reduce the distance between the pixels from the millimeter level to the micrometer level. Also, the color saturation is close to OLED, so many manufacturers regard micro LED as the display technology of the next generation.

The known micro LED array is fabricated by a micro transfer printing method: an LED bare chip is separated from a sapphire substrate by a laser lift-off (LLO) technique, and a patterned transfer layer is used to absorb the LED bare chip from a supply substrate and transfer to a receiving substrate. Specifically, the receiving substrate is a silicon substrate whose circuit patterns have been prepared in advance. By aligning the transfer layer with the receiving substrate, the LED bare chip absorbed on the transfer layer is attached to the matching position of the receiving substrate, and then is peeled from the transfer layer, which completes the transfer of the LED bare chip. The details of micro transfer printing technology are described in patents such as US2013/0210194, US2013/0128585.

Based on different structures, the known micro LED can be divided into a vertical structure micro LED and a horizontal structure micro LED. The two electrodes of the vertical structure micro LED are respectively located respectively on the upper and lower sides of the light-emitting layer, and both the two electrodes of the horizontal structure micro LED are located on the lower side of the light-emitting layer. Compared to the horizontal-structured micro LED, the vertical-structured micro LED has the following advantages: 1. the manufacturing process is similar to that of the traditional TFT-LCD manufacturing process. Some machines and equipment can be used. 2. the industry has developed some technology to control the leakage current of the vertical-structured micro LED.

In the display panel adopting vertical-structured micro LED, the upper and lower pixel electrodes corresponding to the upper and lower electrodes must be disposed to drive the operation, wherein the upper pixel electrode is fabricated on the package substrate, and the lower pixel electrode is fabricated on the driving substrate, and then the package substrate and the driving substrate are paired and assembled to obtain a micro LED display panel. When pair-assembling the package substrate and the drive substrate, because the top of the micro LED is uneven, that is, the height of each micro LED is not entirely the same, a part of upper pixel electrodes may not correctly attach to the upper electrodes of the micro LED, which results in the problem that the upper pixel electrode and the upper electrode of the micro LED cannot be electrically connected.

SUMMARY OF THE INVENTION

The object of the present invention is to provide a manufacturing method of micro LED display panel, able to improve the pair-assembling effect of the micro LED display panel and avoid poor connection between the upper pixel electrode and the upper electrode of the micro LED.

Another object of the present invention is to provide a micro LED display panel, able to improve the pair-assembling effect of the micro LED display panel and avoid poor connection between the upper pixel electrode and the upper electrode of the micro LED.

To achieve the above object, the present invention provides a manufacturing method of micro LED display panel, which comprises:

Step S1: providing a driving substrate, forming a plurality of lower pixel electrodes arranged in an array on the driving substrate, forming a vertical-structured micro LED respectively on each lower pixel electrode, with each lower pixel electrode electrically connected to a lower electrode of the corresponding micro LED;

Step S2: providing a package substrate, forming a plurality of upper pixel electrodes arranged in an array on the package substrate, and forming an elastic conductive layer on each upper pixel electrode;

Step S3: pair-assembling and pressing the package substrate and the driving substrate, so that each upper pixel electrode being fixedly attached to the corresponding micro LED through the elastic conductive layer and electrically connected to an upper electrode of the micro LED.

Preferably, in step S2, the elastic conductive layer is formed by applying a first solution on each upper pixel electrode.

Preferably, the first solution comprises a first solvent and a plurality of elastic conductive balls dispersed in the first solvent, and the first solvent is a curable solvent.

Preferably, in step S3, a curing process is performed while the package substrate and the driving substrate are pair-assembled and pressed, so that the first solvent in the elastic conductive layer is cured.

Preferably, before the first solvent is cured, thickness of the elastic conductive layer is less than twice a diameter of the elastic conductive ball in a natural state; after the first solvent is cured, the thickness of the elastic conductive layer is smaller than the diameter of the elastic conductive ball in the natural state.

Preferably, in step S2, the elastic conductive layer is formed by coating an elastic conductive adhesive on each upper pixel electrode.

Preferably, before pair-assembling the package substrate and the drive substrate pair, the manufacturing method further comprises a step of forming a support on the driving substrate or the package substrate.

The present invention also provides a micro LED display panel, which comprises: a driving substrate, a package substrate disposed opposite to the driving substrate, a plurality of lower pixel electrodes disposed in an array on a side of the driving substrate near the package substrate, a plurality of upper pixel electrodes disposed in an array opposite to the plurality of lower pixel electrodes on a side of the package substrate near the driving substrate, a micro LED disposed between each lower pixel electrode and each upper pixel electrode, and an elastic conductive layer disposed between the micro LED and the corresponding upper pixel electrode; the micro LED being a vertical-structured micro LED, and each lower pixel electrode being respectively electrically connected to a lower electrode of the corresponding micro LED, and each upper pixel electrodes being respectively electrically connected to an upper electrode of the corresponding micro LED through the elastic conductive layer.

Preferably, the elastic conductive layer is made of a first solution or an elastic conductive adhesive; the first solution comprises a first solvent and a plurality of elastic conductive balls dispersed in the first solvent, and the first solvent is a curable solvent.

Preferably, the micro LED display panel further comprises a support disposed on the driving substrate at a side near the package substrate or on the package substrate at a side near the driving substrate.

The present invention also provides a manufacturing method of micro LED display panel, which comprises:

Step S1: providing a driving substrate, forming a plurality of lower pixel electrodes arranged in an array on the driving substrate, forming a vertical-structured micro LED respectively on each lower pixel electrode, with each lower pixel electrode electrically connected to a lower electrode of the corresponding micro LED;

Step S2: providing a package substrate, forming a plurality of upper pixel electrodes arranged in an array on the package substrate, and forming an elastic conductive layer on each upper pixel electrode;

Step S3: pair-assembling and pressing the package substrate and the driving substrate, so that each upper pixel electrode being fixedly attached to the corresponding micro LED through the elastic conductive layer and electrically connected to an upper electrode of the micro LED;

wherein in step S2, the elastic conductive layer being formed by applying a first solution on each upper pixel electrode; the first solution comprising a first solvent and a plurality of elastic conductive balls dispersed in the first solvent, and the first solvent being a curable solvent; in step S3, a curing process being performed while the package substrate and the driving substrate being pair-assembled and pressed to cure the first solvent in the elastic conductive layer;

wherein before pair-assembling the package substrate and the drive substrate pair, further comprising a step of forming a support on the driving substrate or the package substrate.

The present invention provides the following advantages: the present invention provides a manufacturing method of micro LED display panel, which forms an elastic conductive layer on upper pixel electrode on package substrate, and realizes electrical connection between the upper pixel electrode and upper electrode of the micro LED when pair-assembling the package substrate and driving substrate. By utilizing the elasticity of the elastic conductive layer to fill in the height difference between the micro LEDs to avoid poor connection between the upper pixel electrode and the upper electrode of the micro LED, the invention improves the assembling result of the micro LED and the process yield. The present invention also provides a micro LED display panel, which can improve the assembling result of the micro LED and avoid poor connection between the upper pixel electrode and the upper electrode of the micro LED.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

To further explain the technical means and effect of the present invention, the following refers to embodiments and drawings for detailed description.

Figure 1:
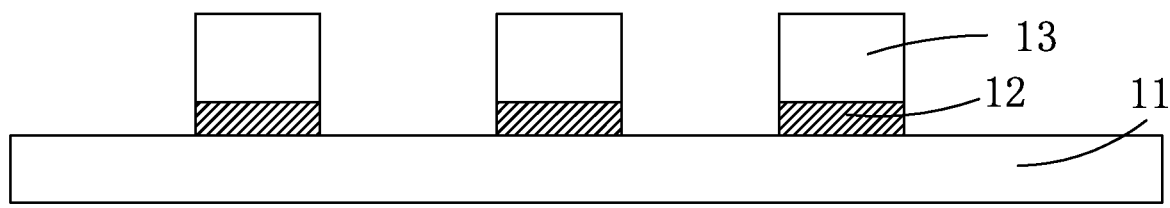
FIG. 1 is a schematic view showing step S1 of the manufacturing method of micro LED display panel provided by an embodiment of the present invention.
Figure 2:
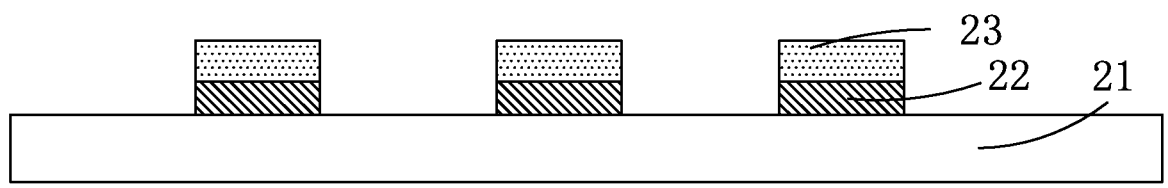
FIG. 2 is a schematic view showing step S2 of the manufacturing method of micro LED display panel provided by an embodiment of the present invention.
Figure 3:
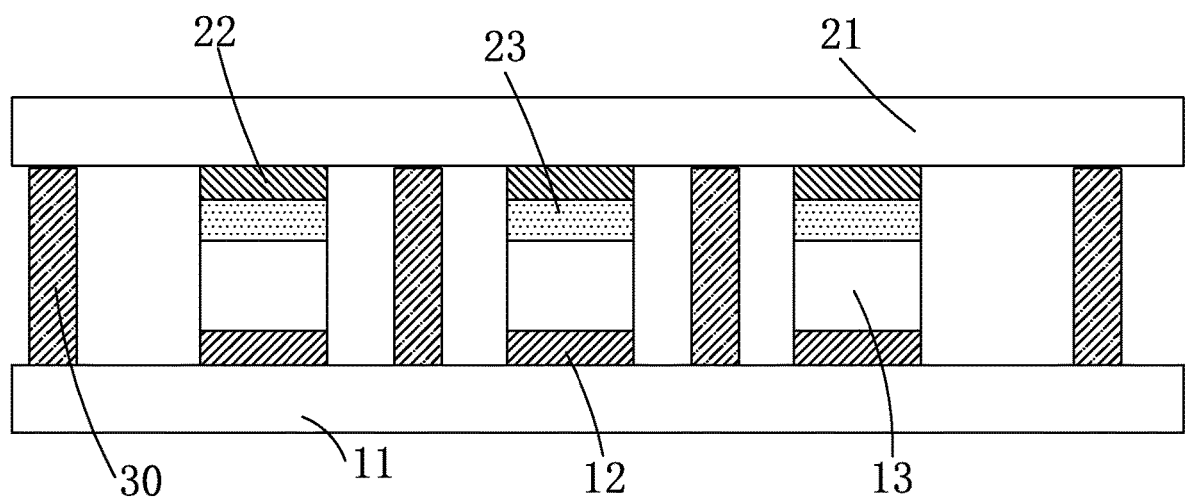
FIG. 3 is a schematic view showing step S3 of the manufacturing method of micro LED display panel and the structure of the micro LED display panel provided by an embodiment of the present invention.
Figure 4:
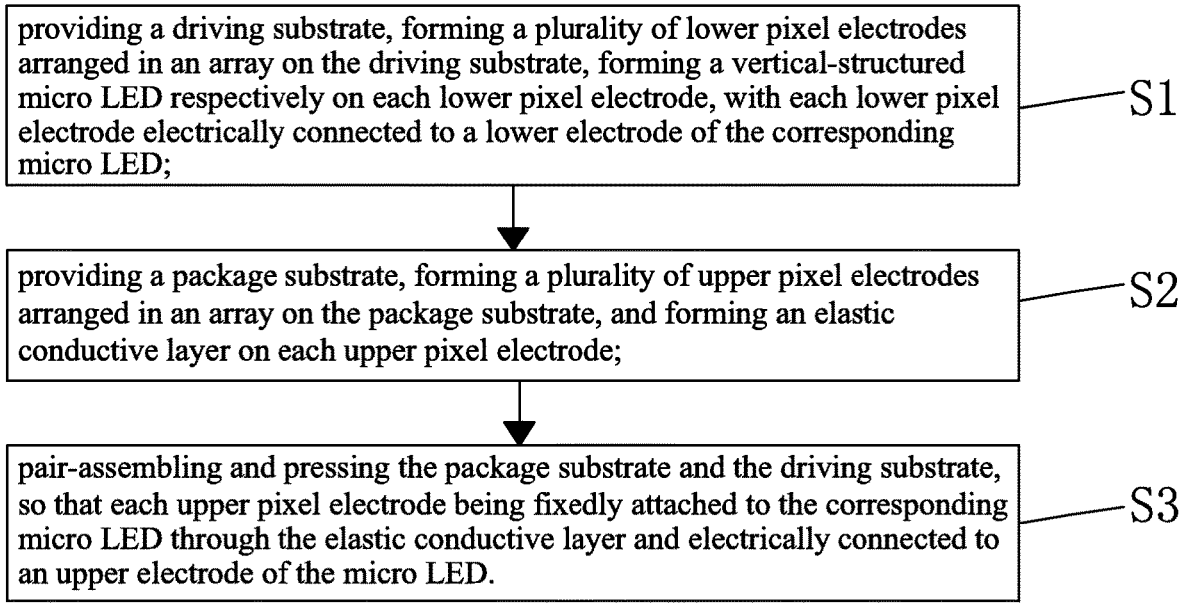
FIG. 4 is a schematic view showing the flowchart of the manufacturing method of micro LED display panel provided by an embodiment of the present invention.

Refer to FIG. 4. The present invention provides a manufacturing method of micro LED display panel, which comprises the flowing steps:

Step S1: as shown in FIG. 1, providing a driving substrate 11, forming a plurality of lower pixel electrodes 12 arranged in an array on the driving substrate 11, forming a vertical-structured micro LED 13 respectively on each lower pixel electrode 12, with each lower pixel electrode 12 electrically connected to a lower electrode of the corresponding micro LED 13;

Step S2: as shown in FIG. 2, providing a package substrate 21, forming a plurality of upper pixel electrodes 22 arranged in an array on the package substrate 21, and forming an elastic conductive layer 23 on each upper pixel electrode 22;

Step S3: as shown in FIG. 3, pair-assembling and pressing the package substrate 21 and the driving substrate 11, so that each upper pixel electrode 22 being fixedly attached to the corresponding micro LED 13 through the elastic conductive layer 23 and electrically connected to an upper electrode of the micro LED 13.

Specifically, in step S2, the elastic conductive layer 23 is formed by applying a first solution on each upper pixel electrode 22. The first solution is a elastic and electrically conductive solution so that the elastic conductive layer 23 is formed by the first solution.

Specifically, in the first embodiment of the present invention, the first solution comprises a first solvent and a plurality of elastic conductive balls dispersed in the first solvent, and the first solvent is a curable solvent. Preferably, the first solvent is a resin solvent or other curable solvent. The elastic conductive ball is a nanometer or micron-sized silicon dioxide ball having outer surface coated with a conductive material, or the elastic conductive ball is a gold (Au) ball. The conductive material covering the silicon dioxide may be carbon nanotubes.

Moreover, in the first embodiment, in step S3, a curing process is performed while the package substrate 21 and the driving substrate 11 are pair-assembled and pressed, so that the first solvent in the elastic conductive layer 23 is cured. The curing process may be selected from heat curing or ultraviolet light curing depending on the properties of the first solvent.

Moreover, in the first embodiment, before the first solvent is cured, thickness of the elastic conductive layer 23 is less than twice a diameter of the elastic conductive ball in a natural state; after the first solvent is cured, the thickness of the elastic conductive layer 23 is smaller than the diameter of the elastic conductive ball in the natural state. As such, after the elastic conductive layer 23 is cured, the upper pixel electrode 22 can maintain good ohmic contact with the upper electrode of the micro LED 13 through the elastic conductive ball.

It should be noted that in the first embodiment of the present invention, the total reflection of the emitting system of the micro LED 13 can also be partially destroyed by providing the elastic conductive ball, so that the light extraction efficiency of the micro LED 13 is higher.

Specifically, in the second embodiment of the present invention, in step S2, the elastic conductive layer 23 is formed by coating an elastic conductive adhesive on each upper pixel electrode 22.

It should be noted that the thickness of the elastic conductive layer 23 in a natural state after the pair-assembling (before pressing) should be greater than the distance from the upper electrode of the lowest-level Micro LED 13 to the corresponding upper pixel electrode 22 so that after the elastic conductive layers 23 is pressed, the entire elastic conductive layers 23 can contact the upper electrode of the corresponding Micro LED 13. As such, the upper pixel electrode 22 and the upper electrode of the Micro LED 13 maintain good Ohmic contact.

Specifically, to improve the pressure-endurance capability of the drive substrate 11 and the package substrate 21, the present invention further comprises the step of forming a support 30 on the driving substrate 11 or the package substrate 21 before the package substrate 21 and the driving substrate 11 are pair-assembled. The supporter 30 has a height smaller than a gap between the driving substrate 11 and the package substrate 21. Furthermore, corresponding to the first embodiment of the present invention, the sum of the height of the support 30 and the diameter of the elastic conductive ball in the natural state should also be greater than the gap between the driving substrate 11 and the package substrate 21.

Moreover, as shown in FIG. 3, the present invention also provides a micro LED display panel, which comprises: a driving substrate 11, a package substrate 21 disposed opposite to the driving substrate 11, a plurality of lower pixel electrodes 12 disposed in an array on a side of the driving substrate 11 near the package substrate 21, a plurality of upper pixel electrodes 22 disposed in an array opposite to the plurality of lower pixel electrodes 12 on a side of the package substrate 21 near the driving substrate 11, a micro LED 13 disposed between each lower pixel electrode 12 and each upper pixel electrode 13, and an elastic conductive layer 23 disposed between the micro LED 13 and the corresponding upper pixel electrode 22; the micro LED 13 being a vertical-structured micro LED, and each lower pixel electrode 12 being respectively electrically connected to a lower electrode of the corresponding micro LED 13, and each upper pixel electrodes 22 being respectively electrically connected to an upper electrode of the corresponding micro LED 13 through the elastic conductive layer 23.

Specifically, in the first embodiment of the present invention, the elastic conductive layer 23 is made of a first solution or an elastic conductive adhesive; the first solution comprises a first solvent and a plurality of elastic conductive balls dispersed in the first solvent, and the first solvent is a curable solvent.

Preferably, the first solvent is a resin solvent or other curable solvent. The elastic conductive ball is a nanometer or micron-sized silicon dioxide ball having outer surface coated with a conductive material, or the elastic conductive ball is a gold (Au) ball. The conductive material covering the silicon dioxide may be carbon nanotubes.

Moreover, in the first embodiment, a curing process is performed on the elastic conductive layer 23 formed by coating the first solution so that the first solvent in the elastic conductive layer 23 is cured. The curing process may be selected from heat curing or ultraviolet light curing depending on the properties of the first solvent.

Moreover, in the first embodiment, before the first solvent is cured, thickness of the elastic conductive layer 23 is less than twice a diameter of the elastic conductive ball in a natural state; after the first solvent is cured, the thickness of the elastic conductive layer 23 is smaller than the diameter of the elastic conductive ball in the natural state. As such, after the elastic conductive layer 23 is cured, the upper pixel electrode 22 can maintain good ohmic contact with the upper electrode of the micro LED 13 through the elastic conductive ball.

It should be noted that in the first embodiment of the present invention, the total reflection of the emitting system of the micro LED 13 can also be partially destroyed by providing the elastic conductive ball, so that the light extraction efficiency of the micro LED 13 is higher.

Specifically, in the second embodiment of the present invention, the elastic conductive layer 23 is formed by coating an elastic conductive adhesive on each upper pixel electrode 22.

It should be noted that the thickness of the elastic conductive layer 23 in a natural state after the pair-assembling (before pressing) should be greater than the distance from the upper electrode of the lowest-level Micro LED 13 to the corresponding upper pixel electrode 22 so that after the elastic conductive layers 23 is pressed, the entire elastic conductive layers 23 can contact the upper electrode of the corresponding Micro LED 13. As such, the upper pixel electrode 22 and the upper electrode of the Micro LED 13 maintain good Ohmic contact.

Specifically, to improve the pressure-endurance capability of the drive substrate 11 and the package substrate 21, the present invention further comprises a support 30 formed on the driving substrate 11 at a side near the package substrate 21 or on the package substrate 21 at a side near the driving substrate 11. The supporter 30 has a height smaller than a gap between the driving substrate 11 and the package substrate 21.

Furthermore, corresponding to the first embodiment of the present invention, the sum of the height of the support 30 and the diameter of the elastic conductive ball in the natural state should also be greater than the gap between the driving substrate 11 and the package substrate 21.

In summary, the present invention provides a manufacturing method of micro LED display panel, which forms an elastic conductive layer on upper pixel electrode on package substrate, and realizes electrical connection between the upper pixel electrode and upper electrode of the micro LED when pair-assembling the package substrate and driving substrate. By utilizing the elasticity of the elastic conductive layer to fill in the height difference between the micro LEDs to avoid poor connection between the upper pixel electrode and the upper electrode of the micro LED, the invention improves the assembling result of the micro LED and the process yield. The present invention also provides a micro LED display panel, which can improve the assembling result of the micro LED and avoid poor connection between the upper pixel electrode and the upper electrode of the micro LED.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A manufacturing method of micro light-emitting diode (LED) display panel, comprising the following steps:
    Step S1: providing a driving substrate, forming a plurality of lower pixel electrodes arranged in an array on the driving substrate, forming a vertical-structured micro LED respectively on each lower pixel electrode, with each lower pixel electrode electrically connected to a lower electrode of the corresponding micro LED;
    Step S2: providing a package substrate, forming a plurality of upper pixel electrodes arranged in an array on the package substrate, and forming an elastic conductive layer on each upper pixel electrode;
    Step S3: pair-assembling and pressing the package substrate and the driving substrate, so that each upper pixel electrode being fixedly attached to the corresponding micro LED through the elastic conductive layer and electrically connected to an upper electrode of the micro LED;
    wherein the elastic conductive layer is formed by applying a first solution on each upper pixel electrode, wherein the first solution comprises a first solvent and a plurality of elastic conductive balls disposed in the first solvent, the first solvent being a curable solvent, such that the elastic conductive layer is changeable, through curing of the first solvent, from a first condition of having a first thickness less than twice a diameter of the elastic conductive balls in a natural state to a second condition of having a second thickness less than the diameter of the elastic conductive balls in the natural state.

2. The manufacturing method of micro LED display panel as claimed in claim 1, wherein in step S3, a curing process is performed while the package substrate and the driving substrate are pair-assembled and pressed, so that the first solvent in the elastic conductive layer is cured.

3. The manufacturing method of micro LED display panel as claimed in claim 1, wherein before pair-assembling the package substrate and the drive substrate pair, the manufacturing method further comprises a step of forming a support on the driving substrate or the package substrate.

4. A micro light-emitting diode (LED) display panel, comprising: a driving substrate, a package substrate disposed opposite to the driving substrate, a plurality of lower pixel electrodes disposed in an array on a side of the driving substrate near the package substrate, a plurality of upper pixel electrodes disposed in an array opposite to the plurality of lower pixel electrodes on a side of the package substrate near the driving substrate, a micro LED disposed between each lower pixel electrode and each upper pixel electrode, and an elastic conductive layer disposed between the micro LED and the corresponding upper pixel electrode; the micro LED being a vertical-structured micro LED, and each lower pixel electrode being respectively electrically connected to a lower electrode of the corresponding micro LED, and each upper pixel electrodes being respectively electrically connected to an upper electrode of the corresponding micro LED through the elastic conductive layer,
    wherein the elastic conductive layer is made of a first solution and a plurality of elastic conductive balls dispersed in the first solvent, the first solvent being a curable solvent, such that the elastic conductive layer is changeable, through curing of the first solvent, from a first condition of having a first thickness less than twice a diameter of the elastic conductive balls in a natural state to a second condition of having a second thickness less than the diameter of the elastic conductive balls in the natural state.

5. The micro LED display panel as claimed in claim 4, wherein the micro LED display panel further comprises a support disposed on the driving substrate at a side near the package substrate or on the package substrate at a side near the driving substrate.

6. A manufacturing method of micro light-emitting diode (LED) display panel, comprising the following steps:
    Step S1: providing a driving substrate, forming a plurality of lower pixel electrodes arranged in an array on the driving substrate, forming a vertical-structured micro LED respectively on each lower pixel electrode, with each lower pixel electrode electrically connected to a lower electrode of the corresponding micro LED;
    Step S2: providing a package substrate, forming a plurality of upper pixel electrodes arranged in an array on the package substrate, and forming an elastic conductive layer on each upper pixel electrode;
    Step S3: pair-assembling and pressing the package substrate and the driving substrate, so that each upper pixel electrode being fixedly attached to the corresponding micro LED through the elastic conductive layer and electrically connected to an upper electrode of the micro LED;
    wherein the elastic conductive layer is formed by applying a first solution on each upper pixel electrode wherein the first solution comprises a first solvent and a plurality of elastic conductive balls dispersed in the first solvent, and the first solvent being a curable solvent, such that the elastic conductive layer is changeable, through curing of the first solvent, from a first condition of having a first thickness less than twice a diameter of the elastic conductive balls in a natural state to a second condition of having a second thickness less than the diameter of the elastic conductive balls in the natural state;
    wherein in step S3, a curing process is performed while the package substrate and the driving substrate are pair-assembled and pressed, so that the first solvent in the elastic conductive layer is cured; and wherein before pair-assembling the package substrate and the drive substrate pair, the manufacturing method further comprises a step of forming a support on the driving substrate or the package substrate.

\* \* \* \* \*